United States Patent [19]
Confalonieri et al.

[11] Patent Number: 5,617,055
[45] Date of Patent: Apr. 1, 1997

[54] ELECTRONIC SWITCH HAVING REDUCED BODY EFFECT

[75] Inventors: Pierangelo Confalonieri, Bergamo; Germano Nicollini, Piacenza, both of Italy

[73] Assignee: SGS-Thomson Microelectronics S.r.l., Agrate Brianza, Italy

[21] Appl. No.: 509,304

[22] Filed: Jul. 31, 1995

[30] Foreign Application Priority Data

Jul. 29, 1994 [EP] European Pat. Off. ............ 948303870

[51] Int. Cl.[6] ................................................ H03K 17/62
[52] U.S. Cl. ........................ 327/404; 327/403; 327/537
[58] Field of Search .................................. 327/403–405, 327/407–413, 415–417, 427, 534, 537, 579, 374–377

[56] References Cited

U.S. PATENT DOCUMENTS

| | | | |
|---|---|---|---|
| 3,569,729 | 3/1971 | Washizuka et al. | 327/534 |
| 4,985,703 | 1/1991 | Kaneyama | 327/408 |
| 5,023,688 | 6/1991 | Ando et al. | 357/42 |
| 5,065,057 | 11/1991 | Kawasaki | 307/572 |
| 5,506,528 | 4/1996 | Cao et al. | 327/374 |

FOREIGN PATENT DOCUMENTS

| | | | |
|---|---|---|---|
| 55-143837 | 11/1980 | Japan | H03K 17/687 |
| 58-186224 | 10/1983 | Japan | H03K 17/687 |

OTHER PUBLICATIONS

Denton et al., "The Long Term Reliability of a Switched-Capacitor Relative Humidity Sensor System," in *Proceedings of the 33rd Midwest Symposium on Circuits and Systems*, Calgary, Alberta, Canada, Aug. 12–15, 1990, pp. 854–857.

*Primary Examiner*—Toan Tran
*Attorney, Agent, or Firm*—Seed and Berry LLP; David V. Carlson; Bryan A. Santarelli

[57] ABSTRACT

An electronic switch having a reduced body effect includes first and second switch terminals. A first transistor of a first type has a control terminal, a first substrate coupled to a first voltage level, and first and second drive terminals respectively coupled to the first and second switch terminals. A second transistor of a second type has a control terminal, a second substrate, a first drive terminal coupled to the second substrate and to the first switch terminal, and a second drive terminal. A third transistor of the second type has a control terminal, a third substrate, a first drive terminal coupled to the second drive terminal of the second transistor, and a second drive terminal coupled to the third substrate and to the second switch terminal. A fourth transistor of a first type has a control terminal, a fourth substrate, a first drive terminal coupled to the second drive terminal of the second transistor, and a second drive terminal coupled to the fourth substrate and a first voltage level.

29 Claims, 3 Drawing Sheets

ELECTRONIC SWITCH HAVING REDUCED BODY EFFECT

TECHNICAL FIELD

The present invention relates to the switching circuitry means for integrated circuits and specifically to an electronic switch for low-voltage supply circuits integrated with CMOS technology.

BACKGROUND OF THE INVENTION

The switching circuitry means are indispensable in various integrated circuit applications such as, for example, switched capacitor circuits for filters with reduced harmonic distortion in which the electronic switches realized with MOS transistors are driven by distinct timing signals without superimposed phases.

A rather simple type of electronic switch commonly used by those skilled in the art is the so-called 'pass-transistor' consisting of two complementary CMOS transistors connected in mutual parallel with their respective source and drain terminals and driven by signals in phase opposition upon switching.

Such a switch often does not exhibit shortcomings in integrated circuits with sufficiently high power supply voltage on the order of at least 5 V.

But when the supply voltage is lower, typically around 3 V, as is the present trend for many integrated circuits, it is necessary to take in consideration what in the technical literature is known as 'body' effect where the term 'body' indicates the actual substrate of a transistor.

Indeed, in any CMOS process, one of two complementary transistors is provided in its own substrate called a well or tub.

For example, in an N-well CMOS process, it is the p-channel transistor which is provided in an independent substrate defined N-well and vice versa for the P-well CMOS process.

As known to those skilled in the art, the actual threshold voltage upon conduction of the transistors of an integrated circuit of the CMOS type depends on the 'body' effect in accordance with which the actual threshold voltage VTH of a transistor increases in absolute value when the voltage VSB between source and body of the transistor is other than zero, i.e., if the transistor substrate is not short-circuited with the source region, and is the highest when the source region is insulated from the substrate.

For the best operation of a pass-transistor the n-channel transistor substrate is kept at the lowest potential existing in the integrated circuit while the substrate of the p-channel transistor is kept at the highest potential.

If the supply voltage is too low, for certain voltages values, at the two ends of the switch it may be impossible, due to the body effect, to switch to conduction at least one of the two transistors which constitute the pass-transistor and thus permit correct operation of the switch.

As explained in the article 'Higher Sampling Rates in SC Circuits by On-Chip Clock-Voltage Multiplication' by F. Krummenacher, H. Pinier and A. Guillaume Laboratoire d' électronique général, EPFL, Lausanne, Switzerland—the solution used by those skilled in the art is that of driving the switch transistors with signals in 'voltage-boosted' phase opposition, i.e. having amplitude almost doubled with respect to the value of the power supply voltage.

Correct operation of the switch is thus assured even with low supply voltages, but this solution involves the shortcoming of requiring a complicated circuit for generation of the voltage-boosted driving signals.

SUMMARY OF THE INVENTION

Thus, a need exists for an electronic switch with MOS transistors that avoids the shortcomings due to body effect while keeping circuitry simplicity.

In accordance with one aspect of the present invention, an electronic switch includes first and second switch terminals. A first transistor of a first type has a control terminal, a first substrate coupled to first voltage level, and first and second drive terminals respectively coupled to the first and second switch terminals. A second transistor of a second type has a control terminal, a second substrate, a first drive terminal coupled to the second substrate and to the first switch terminal, and a second drive terminal. A third transistor of the second type has a control terminal, a third substrate, a first drive terminal coupled to the second drive terminal of the second transistor, and a second drive terminal coupled to the third substrate and to the second switch terminal. A fourth transistor of a first type has a control terminal, a fourth substrate, a first drive terminal coupled to the second drive terminal of the second transistor, and a second drive terminal coupled to the fourth substrate and a first voltage level.

An advantage provided by one aspect of the present invention is an electronic switch having a reduced body effect.

An advantage provided by another aspect of the invention is an electronic switch that is suitable for use with low-voltage CMOS circuits.

BRIEF DESCRIPTION OF THE DRAWINGS

The characteristics and advantages of the various aspects of the present invention are set forth in the description of an embodiment thereof given below by way of non-limiting example with reference to the annexed drawings. In the drawings.

DETAILED DESCRIPTION OF THE INVENTION

An electronic switch in accordance with the present invention is provided by making use of the fact that in any CMOS process, one of the two transistors is achieved in its own substrate with conductivity opposite that of the actual substrate in which is provided the other transistor.

By utilizing the circuitry diagrams displayed in the figures and appropriately connecting the substrates of the complementary transistors contained in said diagrams to maximum potential and minimum potential references of the integrated circuit, there are obtained in accordance with the same inventive concept electronic switches substantially free of the 'body' effect.

Figure 1:
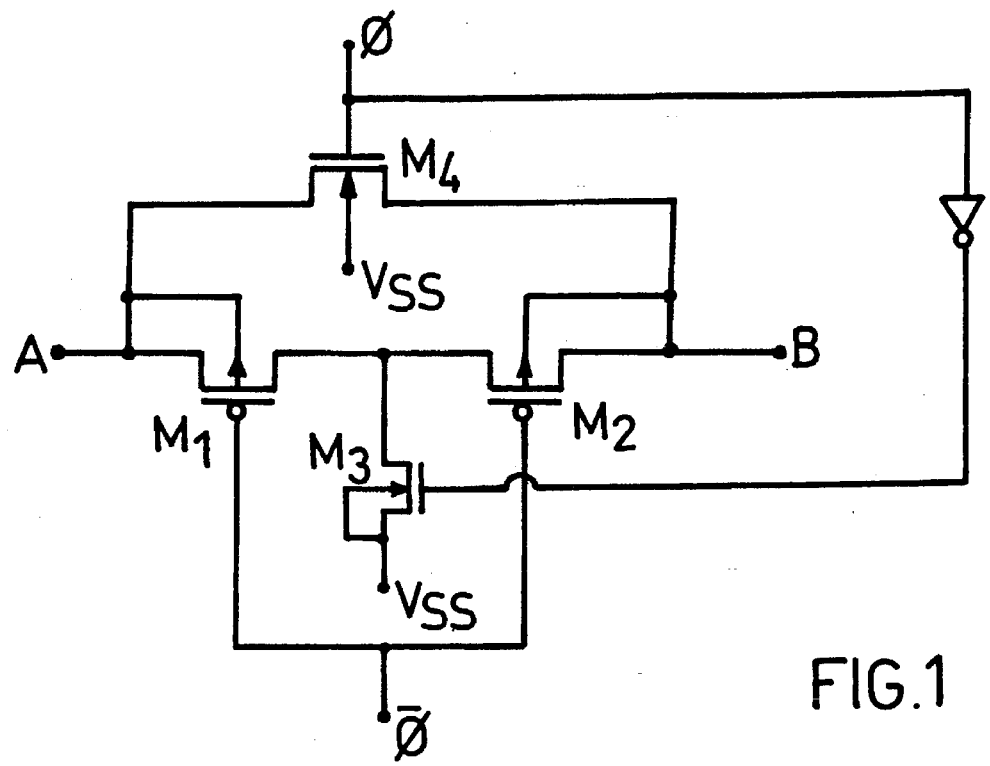
FIGS. 1, 2, 3 and 4 show circuit diagrams for an electronic switch in accordance with various aspects of the present invention for use in integrated circuits with CMOS processes of the classical type.

In the diagram of FIG. 1 are included a first and second p-channel transistors M1 and M2 inserted in mutual series by means of the source and drain terminals between two connection terminals A and B.

A third transistor, M3, with an n channel, is inserted between a connection node of the transistors M1 and M2 and a minimum potential reference VSS of the integrated circuit that includes the electronic switch in accordance with the present invention.

A fourth transistor, M4, also with an n channel, is inserted between the connection terminals A and B in parallel with the transistors M1 and M2 by means of the source and drain terminals.

The substrate of the transistor M1 and the substrate of the transistor M2 are connected to the switch connection terminals A and B respectively.

The substrate of the transistors M3, M4 are connected to the potential reference VSS.

The gate terminal of the transistor M4 is driven with a $\phi$ signal in phase opposition both with the transistors M1 and M2 driven with a $\bar{\phi}$ signal applied to their gate terminals and to the transistor M3 driven by the same $\phi$ signal but through an inverter.

Figure 2:
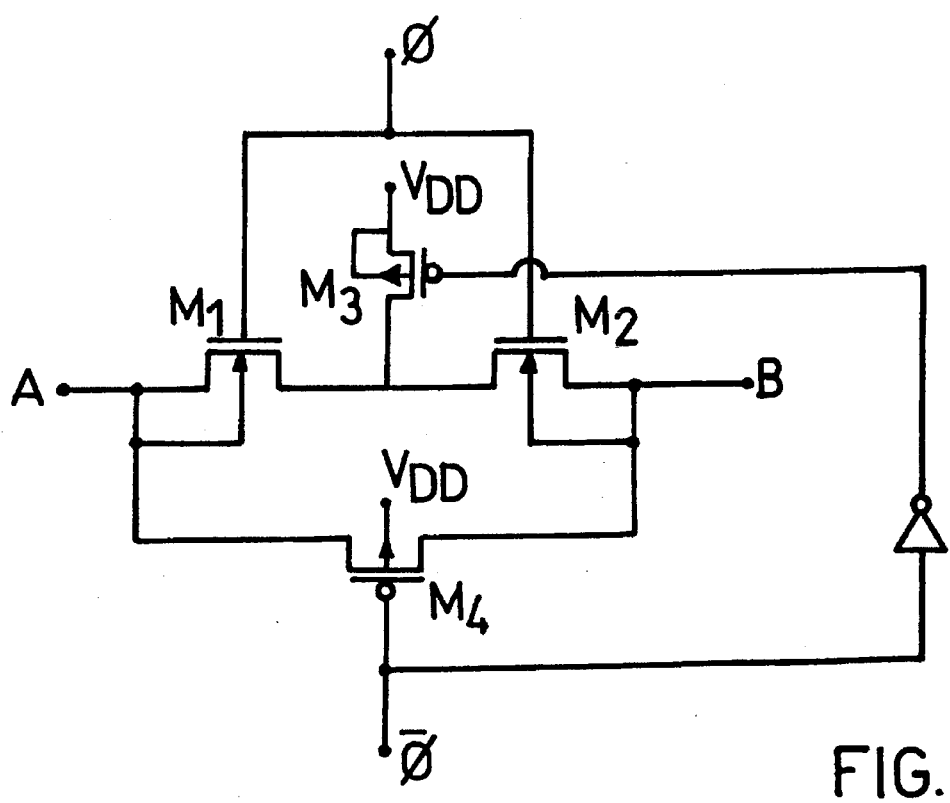

FIG. 2 shows a dual case with opposite polarities in which the reference VDD is a maximum potential reference in the integrated circuit.

Figure 3:
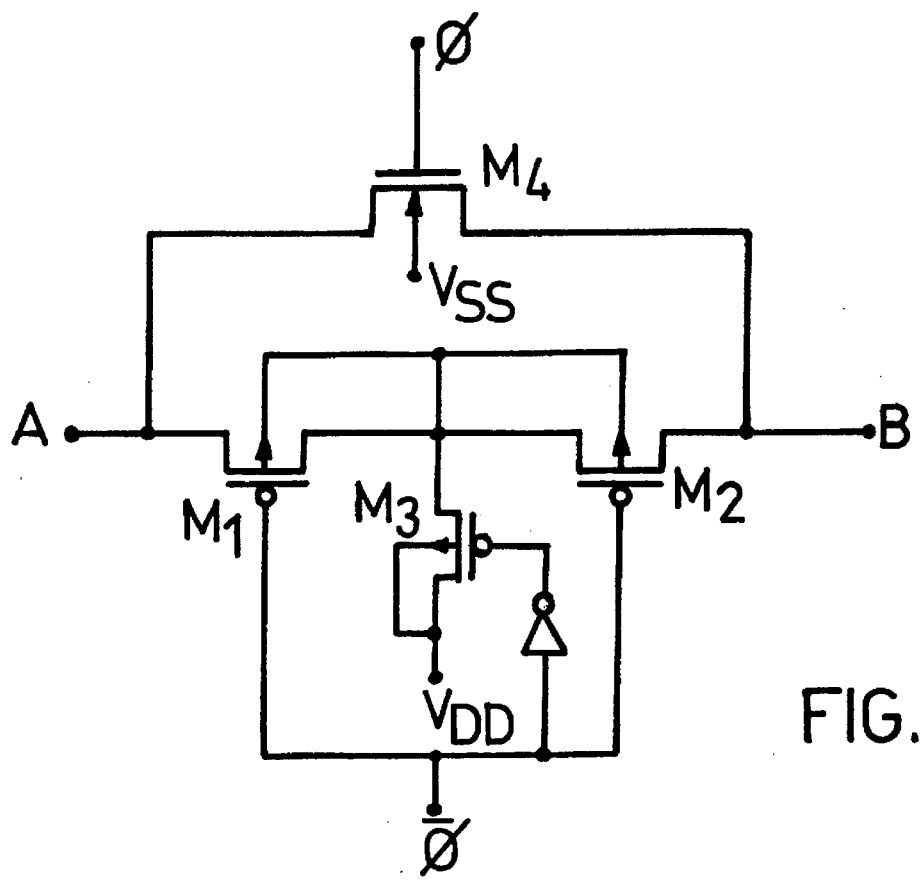

In the diagram shown in FIG. 3, the transistor M3 is a p channel instead of an n channel and therefore its substrate, differently from the diagram shown in FIG. 1, is connected to a maximum potential reference VDD in the integrated circuit and not to the minimum potential reference VSS.

The transistor M3 is also driven in phase opposition in relation to the transistors M1 and M2.

The substrates of the transistors M1 and M2 are connected to the connection node between said transistors and the transistor M3.

Figure 4:
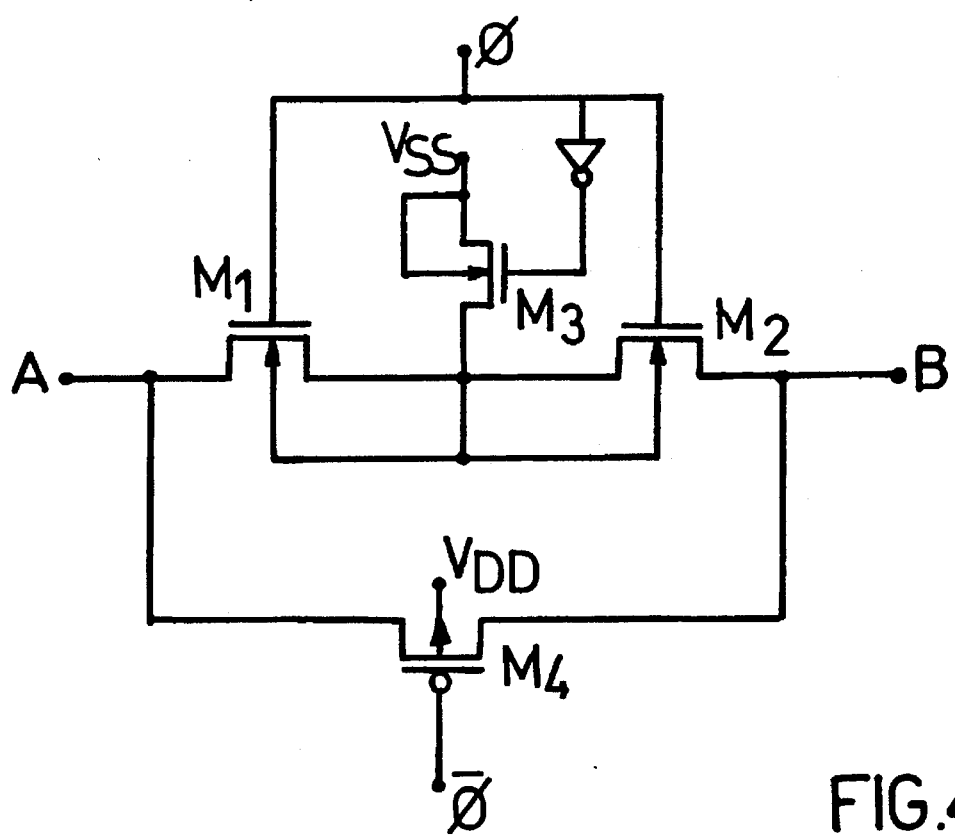

FIG. 4 shows a dual case with polarities opposite those of FIG. 3.

The circuitry diagrams shown in FIGS. 1, 2, 3 and 4 comprise a single transistor M4 in parallel with the other two M1 and M2

Such a solution is suitable for use with the normal CMOS integration processes.

Figure 5:
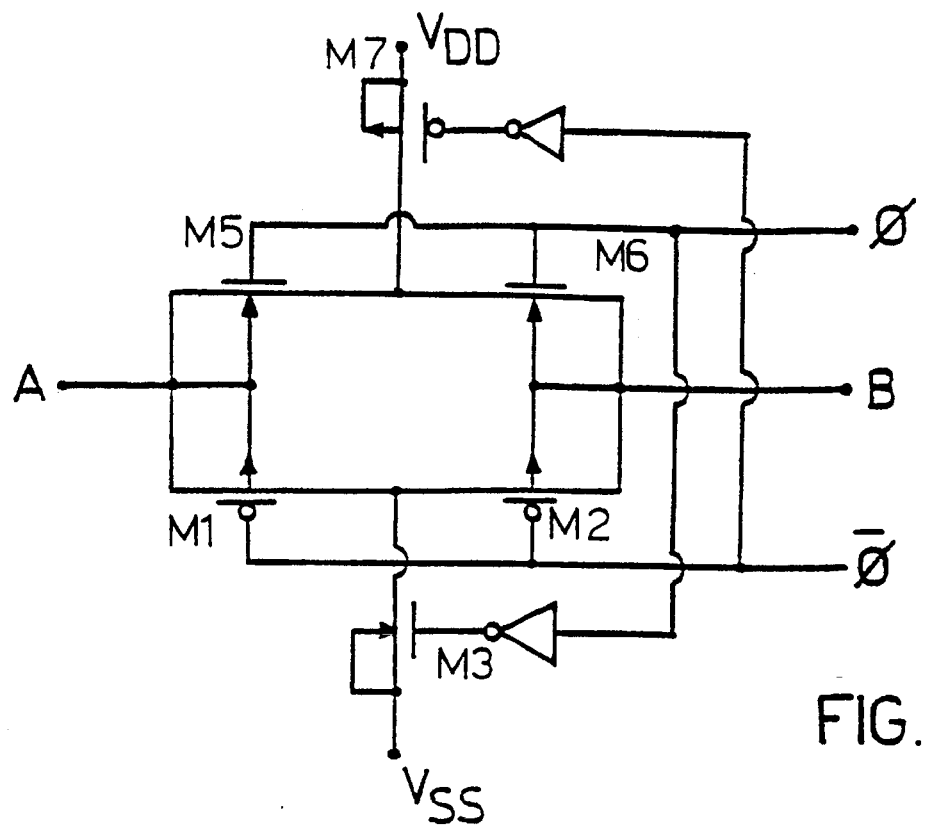
FIGS. 5 and 6 show circuitry diagrams for an electronic switch in accordance with other aspects of the present invention for use in integrated circuits with CMOS processes of the 'twin-tub' type.
Figure 6:
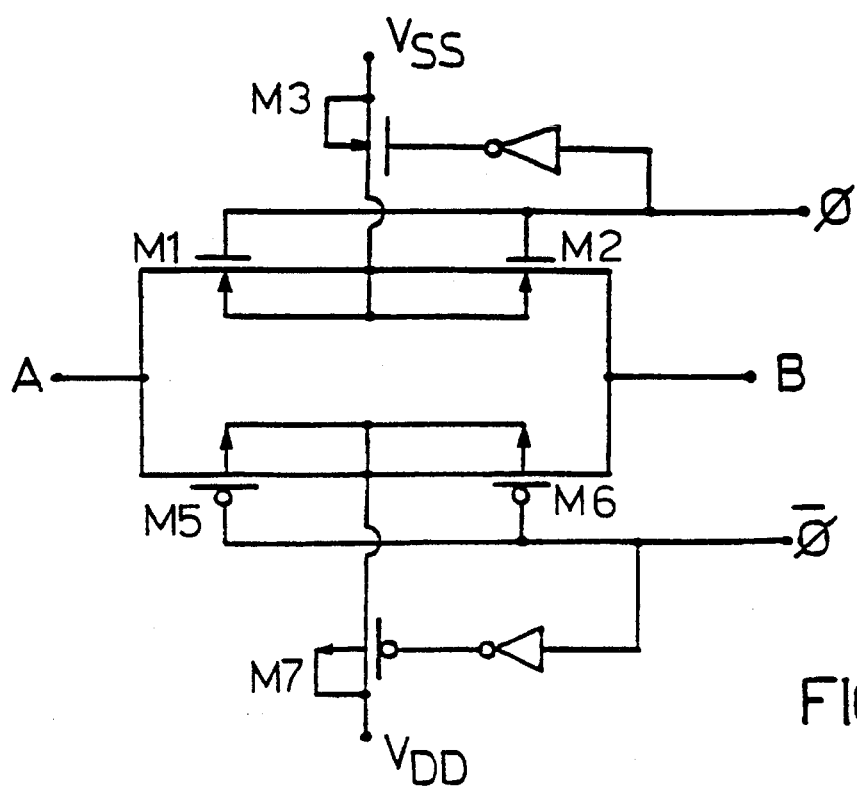

Referring to FIGS. 5 and 6, however, with the 'twin tub' CMOS integration processes, such as for example generally those of the Bi-CMOS type, the single transistor M4 can be replaced with another pair of transistors M5 and M6 in series mutually and with a connection node coupled to a potential reference through a transistor M7 in a configuration similar to that of transistors M1, M2, and M3.

The principal characteristics of the present invention are that the substrates of the transistors connected in series are each connected to a terminal of their own transistor in every operating condition thus avoiding the so-called 'body' effect and that the transistor inserted between the transistor pair and the potential reference prevent inappropriate charge injections when the switch is open.

Although not indispensable, the use of an inverter to pilot the latter transistor (M3) with the signal $\phi$ and not the signal $\bar{\phi}$ ensures its starting only after turning off of the transistor pair in series.

Of course modifications and variations can be made to the device described above by way of nonlimiting example all however falling within the protective scope of the following claims.

What is claimed is:

1. An electronic switch having a reduced body effect, comprising:

first and second switch terminals;

a first transistor of a first type having a control terminal, a first substrate, and first and second drive terminals respectively coupled to said first and second switch terminals;

a second transistor of a second type having a control terminal, a second substrate, a first drive terminal coupled to said second substrate and to said first switch terminal, and a second drive terminal;

a third transistor of a second type having a control terminal, a third substrate, a first drive terminal coupled to said second drive terminal of said second transistor, and a second drive terminal coupled to said third substrate and to said second switch terminal; and a fourth transistor having a control terminal, a fourth substrate, a first drive terminal coupled to said second drive terminal of said second transistor, and a second drive terminal coupled to said fourth substrate and a first voltage level.

2. The switch of claim 1 wherein said fourth transistor is of said first type.

3. The switch of claim 1 wherein said fourth transistor is of said second type.

4. The switch of claim 1 wherein:

said first type of transistor is an n-channel transistor; and said second type of transistor is a p-channel transistor.

5. The switch of claim 1 wherein:

said first type of transistor is a p-channel transistor; and said second type of transistor is an n-channel transistor.

6. The switch of claim 1 wherein:

said control terminal of said first transistor is coupled to a first control signal;

said control terminals of said second and third transistors are coupled to a second control signal complementary to said first control signal; and said control terminal of said fourth transistor is coupled to a third control signal that is substantially in phase with said second control signal.

7. The switch of claim 6 further comprising an inverter having an input coupled to said first control signal and an output that provides said third control signal to said control terminal of said fourth transistor.

8. The switch of claim 1 wherein:

said control terminal of said first transistor is coupled to a first control signal;

said control terminals of said second and third transistors are coupled to a second control signal substantially of opposite phase to said first control signal; and said control terminal of said fourth transistor is coupled to a third control signal that is substantially in phase with said first control signal.

9. The switch of claim 8 further comprising an inverter having an input coupled to said second control signal and an output that provides said third control signal to said control terminal of said fourth transistor.

10. The switch of claim 1 further comprising:

a fifth transistor interposed between said first transistor and said second switch terminal, said fifth transistor having a control terminal, a fifth substrate, a first drive terminal coupled to said second drive terminal of said first transistor, and a second drive terminal coupled to said fifth substrate and said second switch terminal;

a sixth transistor having a control terminal, a sixth substrate, a first drive terminal coupled to said first drive terminal of said fifth transistor, and a second drive terminal coupled to said sixth substrate and a second voltage level; and said first substrate coupled to said first switch terminal.

11. The switch of claim 10 wherein:

said control terminals of said first and fifth transistors are coupled to a first control signal;

said control terminals of said second and third transistors are coupled to a second control signal substantially of opposite phase from said first control signal;

said control terminal of said fourth transistor is coupled to a third control signal substantially in phase with said second control signal; and said control terminal of said sixth transistor is coupled to a fourth control signal substantially in phase with said first control signal.

12. An electronic switch having a reduced body effect, comprising:

first and second switch terminals;

a first transistor of a first type having a control terminal, a first substrate, a first drive terminal coupled to said first switch terminal, and a second drive terminal;

a second transistor of said first type having a control terminal, a second substrate coupled to said first substrate, a first drive terminal coupled to said second drive terminal of said first transistor, and a second drive terminal coupled to said second switch terminal;

a third transistor of a second type having a control terminal, a third substrate, a first drive terminal coupled to said first switch terminal, and a second drive terminal;

a fourth transistor of said second type having a control terminal, a fourth substrate coupled to said third substrate, a first drive terminal coupled to said second drive terminal of said third transistor, and a second drive terminal coupled to said second switch terminal;

a fifth transistor of said first type having a control terminal, a fifth substrate, a first drive terminal coupled to said first substrate and said second drive terminal of said first transistor, and a second drive terminal coupled to said fifth substrate and a first voltage level; and a sixth transistor of said second type having a control terminal, a sixth substrate, a first drive terminal coupled to said third substrate and said second drive terminal of said third transistor, and a second drive terminal coupled to said sixth substrate and a second voltage level.

13. The switch of claim 12 wherein said second voltage level is greater than said first voltage level.

14. The switch of claim 12 wherein:

said control terminals of said first and second transistors are driven by a first control signal;

said control terminals of said third and fourth transistors are driven by a second control signal that is substantially complementary to said first control signal;

said control terminal of said fifth transistor is driven by a third control signal substantially complementary to said first control signal; and said control terminal of said sixth transistor is driven by a fourth signal substantially complementary to said second control signal.

15. Electronic switch for a low-voltage supply circuit integrated on a semiconductor substrate with CMOS technology and having at least a first and a second connection terminal and comprising a first transistor having a first and a second terminal and a control terminal and being coupled with said first and second terminals between said first and second connection terminals and characterized in that it comprises a second transistor, a third transistor and a fourth transistor each having a first and a second terminal and a control terminal and the second transistor and the third transistor, of a type complementary to that of the first transistor, being coupled between said first and second connection terminals in mutual series each by means of its own first and second terminals, and the fourth transistor being coupled by means of its own first and second terminals between a connection circuitry node between the second and third transistors and a first potential reference and characterized in that the fourth transistor has a substrate connected to said first potential reference and each of said second transistor and third transistor has a substrate connected to the first terminal of the same transistor.

16. Electronic switch in accordance with claim 15 characterized in that the fourth transistor is the same type as the first transistor and the second transistor and third transistor are connected together each by means of its own second terminal.

17. Electronic switch in accordance with claim 16 characterized in that the first and fourth transistors are n-channel, the second and third transistors are p-channel and the potential of the first reference is equal to the lowest potential in the integrated circuit.

18. Electronic switch in accordance with claim 16 characterized in that the first and fourth transistors are p-channel, the second and third transistors are n-channel, and the potential of the first reference is equal to the highest potential in the integrated circuit.

19. Electronic switch in accordance with claim 15 characterized in that the fourth transistor is the type complementary to that of the first transistor and the second transistor and the third transistor are connected together each by means of its own first terminal.

20. Electronic switch in accordance with claim 19 characterized in that the first transistor is n-channel, the second, third and fourth transistors are p-channel and the potential of the first reference is equal to the highest potential in the integrated circuit.

21. Electronic switch in accordance with claim 19 characterized in that the first transistor is p-channel, the second, third and fourth transistors are n-channel and the potential of the first reference is equal to the lowest potential in the integrated circuit.

22. Electronic switch in accordance with claim 16 and characterized in that the first transistor is driven by signals in phase opposition in relation to those by which are driven the second, third and fourth transistors.

23. Electronic switch in accordance with claim 22 characterized in that it comprises an inverter circuit whose output is coupled to the control terminal of the fourth transistor and to whose input are applied the same signals by which is driven the first transistor.

24. Electronic switch in accordance with claim 19 and characterized in that the first and the fourth transistors are driven by signals in phase opposition in relation to those by which are driven the second and third transistors.

25. Electronic switch in accordance with claim 24 characterized in that it comprises an inverter circuit whose output is coupled to the control terminal of the fourth transistor and to whose input are applied the same signals by which are driven the second and third transistors.

26. Electronic switch for a low-voltage supply circuit integrated on a semiconductor substrate with CMOS technology and having at least a first and a second connection terminals characterized in that it comprises a first and a second transistor each of which has a first and a second terminal and a control terminal and which are coupled in mutual series each with its own first and second terminals between said first and second connection terminals and a third and a fourth transistor each of which has a first and a second terminal and a control terminal and are the type complementary to that of the first and second transistors and are coupled in mutual series each with its own first and second terminals between said first and second connection terminals and in that it comprises a fifth and a sixth transistor of the same type as the third and first transistors respectively and each having a first and a second terminal and a control terminal and the fifth transistor being coupled by means of the first and second terminals between a first potential reference and a first circuitry node for connection between the first and second transistors and the sixth transistor being coupled by means of the first and second terminals between a second circuitry node for connection between the third and fourth transistors and a second potential reference and characterized in that the first and third transistors have substrates connected to the first connection terminal and the second and fourth transistors have substrates connected to the second connection terminal and the fifth and sixth transistors have substrates connected to the first and second potential references respectively.

27. Electronic switch for a low-voltage supply circuit integrated on a semiconductor substrate with CMOS technology and having at least a first and a second connection terminals and characterized in that it comprises a first and a second transistor each of which has a first and a second terminal and a control terminal and which are coupled in mutual series each with its own first and second terminals between said first and second connection terminals and a third and a fourth transistor each of which has a first and a second terminal and a control terminal and are the type complementary to that of the first and second transistors and are coupled in mutual series each with its own first and second terminals between said first and second connection terminals and in that it comprises a fifth and a sixth transistor of the same type as the third and first transistors respectively and each having a first and a second terminal and a control terminal and the fifth transistor being coupled by means of the first and second terminals between a first potential reference and a first circuitry node for connection between the first and second transistors and the sixth transistor being coupled by means of the first and second terminals between a second circuitry node for connection between the third and fourth transistors and a second potential reference and characterized in that the first and second transistors have substrates connected to the first connection circuitry node and the third and fourth transistors have substrates connected to the second connection circuitry node and the fifth and sixth transistors have substrates connected to the first and second potential references respectively.

28. Electronic switch in accordance with claim 26 characterized in that the first, second and fifth transistors are driven by signals in phase opposition in relation to those by which are driven the third, fourth and sixth transistors.

29. Electronic switch in accordance with claim 27 characterized in that the first, second and sixth transistors are driven by signals in phase opposition in relation to those by which are driven the third, fourth and fifth transistors.

* * * * *